United States Patent [19]

Cheung et al.

[11] Patent Number: 5,354,417
[45] Date of Patent: Oct. 11, 1994

[54] ETCHING MOSI₂ USING SF₆, HBR AND O₂

[75] Inventors: Ernest L. Cheung, Cupertino; Patty H. Tsai, San Jose, both of Calif.

[73] Assignee: Applied Materials, Inc., Santa Clara, Calif.

[21] Appl. No.: 135,715

[22] Filed: Oct. 13, 1993

[51] Int. Cl.⁵ .................. H01L 21/306; B44C 1/22
[52] U.S. Cl. .................. 156/643; 156/657; 156/659.1; 252/79.1
[58] Field of Search .......... 156/643, 646, 657, 656, 156/659.1, 662, 345; 252/79.1; 204/192.32, 192.37

[56] References Cited

U.S. PATENT DOCUMENTS

| | | | |
|---|---|---|---|
| 4,360,414 | 11/1982 | Beinvogl | 204/192 E |
| 4,473,436 | 9/1984 | Beinvogl | 156/643 |
| 4,705,595 | 11/1987 | Okudaira et al. | 156/643 |
| 4,726,879 | 2/1988 | Bondur et al. | 156/643 |
| 4,895,810 | 1/1990 | Meyer et al. | 437/41 |
| 4,985,740 | 1/1991 | Shenai et al. | 357/23.4 |
| 4,992,136 | 2/1991 | Tachi et al. | 156/643 |
| 4,994,410 | 2/1991 | Sun et al. | 437/192 |
| 4,997,778 | 3/1991 | Sim et al. | 437/40 |
| 5,013,398 | 5/1991 | Long et al. | 156/643 |
| 5,013,526 | 5/1991 | Kobayashi et al. | 420/430 |
| 5,045,903 | 9/1991 | Meyer et al. | 357/23.4 |
| 5,094,712 | 3/1992 | Becker et al. | 156/643 |
| 5,110,411 | 5/1992 | Long | 156/656 |
| 5,118,387 | 6/1992 | Kadomura | 156/657 |
| 5,147,500 | 9/1992 | Tachi et al. | 156/643 |
| 5,180,464 | 1/1993 | Tatsumi et al. | 156/643 X |
| 5,259,923 | 11/1993 | Hori et al. | 156/643 |

FOREIGN PATENT DOCUMENTS

| | | |
|---|---|---|
| 0407169 | 1/1991 | European Pat. Off. . |
| 0463373 | 1/1992 | European Pat. Off. . |
| 0516043 | 12/1992 | European Pat. Off. . |
| 31825 | 3/1991 | Japan . |

*Primary Examiner*—William Powell
*Attorney, Agent, or Firm*—Ashok K. Janah

[57] ABSTRACT

A process for selectively etching a substrate 20 having a molybdenum silicide layer 25 with a resist material 26 on portions of the molybdenum silicide layer 25 is described. The substrate 26 is placed into an etch zone 54 and the process gas comprising SF₆ and HBr is introduced into the etch zone 54. Preferably, the volumetric flow ratio of SF₆:HBr is from about 1:10 to about 1:1, and more preferably, an oxygen containing gas such as O₂ is added to the process gas. A plasma is generated in the etch zone 54 to form an etch gas from the process gas that anisotropically etches the MoSi$_x$ layer 25 with good selectivity and reduced profile microloading.

17 Claims, 3 Drawing Sheets

ETCHING MOSI₂ USING SF₆, HBR AND O₂

BACKGROUND

The present invention relates to a method for etching molybdenum silicide in semiconductor processing.

Reactive ion etching processes are used to fabricate devices having submicron sized features, such as semiconductor integrated circuit chips. These processes are used to selectively etch a substrate, where portions of the substrate are protected by a patterned etch resistant "resist" material, such as photoresist or oxide hardmask. The resist protected portions form "features" on the substrate which become part of the integrated circuit being processed. Etching is effected by introducing a process gas into a chamber and generating a plasma in the chamber to create an etch gas from the process gas. The etch gas etches the substrate to create volatile etch byproduct compounds, which are then removed from the chamber.

Typically, the process gas is a mixture of gases such as for example a mixture of $Cl_2$ or $CCl_4$, $O_2$, and an inert gas such as He or Ar. Often a chloroflurocarbon gas is added to the process gas. However, there are several problems with these process gases. One problem is that chloroflurocarbon gases are environmentally toxic. Thus, processes using these gases are subject to strict environmental regulations.

Another problem is that these gases chemically react with the resist on the substrate, and cause relatively thick residues or deposits to form on (i) the chamber walls, (ii) the sidewalls of the etched features, and (iii) the resist material. This deposit or residue layer can flake off and form particles that contaminate the wafers. The contaminant particles are not detected until the wafer is fully processed and can results in loss of the entire wafer at a cost of $5,000 or more.

Another problem with these gases is that they etch features having "reentrant" profiles. By reentrant profiles, it is meant that the sidewalls of the features are inwardly sloped, forming angles of less than 85° with the substrate. Reentrant profiles are caused by isotropic etching or undercutting, which occurs when etching proceeds horizontally below the resist layer, instead of vertically through the uncoated portions. It is preferable to have features having vertical sidewalls with angles close to 90°, which occur when the process gas anisotropically etches the substrate and etching proceeds vertically through the uncoated portions of the substrate.

Typical reactive ion etching systems can also result in high profile microloading. High profile microloading occurs when the cross-sectional profile of the features vary as a function of the spacing between the features on the substrate. It is desirable to have an etching process that provides features with uniform cross-sections regardless of the distance between the features, or the density of features.

It is also desirable to obtain high etch rates and a high etching selectivity ratio for process efficacy. The etch selectivity ratio is the ratio of the $MoSi_x$ etch rate to the resist etch rate. A high selectivity ratio is desirable to avoid excessive etching of the resist layer that can result in etching of the substrate below the resist layer.

Accordingly, there is a need for a method for selectively etching molybdenum silicide on semiconductor substrates that minimizes deposits on chamber walls; provides substantially anisotropic etching; and provides reduced profile microloading. It is also desirable to obtain high etch rates and high substrate to resist etch selectivity ratio for process efficacy.

The present invention is directed to a method that satisfies these needs. The method allows substantially anisotropic etching of substrates, reduced residue deposition, reduced profile microloading, high etch rates and a high etch selectivity ratio.

The method of the present invention comprises selectively etching a substrate having a molybdenum silicide layer with a resist material on portions of the molybdenum silicide layer. The method comprises the steps of:

(a) placing a substrate into an etch zone;

(b) introducing a process gas comprising $SF_6$ and HBr into the etch zone, the volumetric flow ratio of $SF_6$:HBr being from about 1:10 to about 1:1; and (c) generating a plasma in the etch zone to form an etch gas from the process gas, wherein the etch gas selectively etches the molybdenum silicide layer on the substrate.

Preferably, the process gas further comprises an oxygen containing gas. Preferably, the volumetric flow ratio of $SF_6$:HBr:oxygen containing gas is selected so that the sidewalls of the etched features are smooth and form angles of at least about 85° with the substrate. More preferably, the flow ratio is selected so that the molybdenum silicide to resist etching selectivity ratio is greater than about 0.6, and most preferably, the flow ratio is selected so that molybdenum silicide etch rate is greater than about 500 Å/minute.

BRIEF DESCRIPTION OF THE DRAWINGS

These and other features, aspects, and advantages of the present invention will become better understood from the following drawings, description and appended claims, where:

DESCRIPTION

The present invention is directed to a reactive ion etching process for selectively etching a substrate having a molybdenum silicide layer and a resist material on portions of the molybdenum silicide layer, by using a process gas comprising $SF_6$ and HBr. Preferably, an oxygen containing gas is added to the process gas. The process gas is introduced into an etching zone containing the substrate. A plasma is generated from the process gas to form an etch gas which selectively etches the substrate.

Figure 1A:
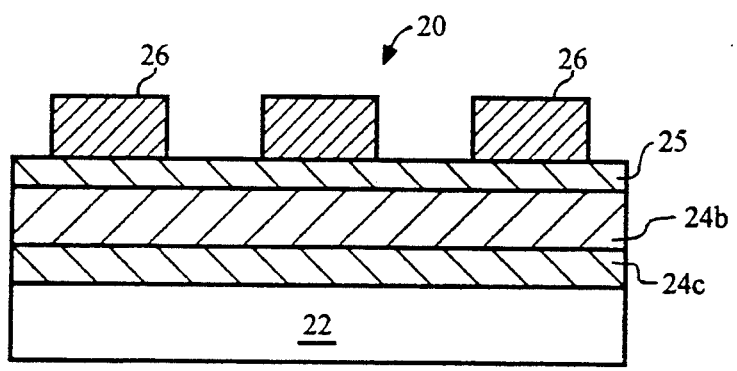
FIG. 1a is a schematic view in vertical cross-section of a substrate having a molybdenum silicide layer with a resist material on portions of the molybdenum silicide layer.
Figure 1B:
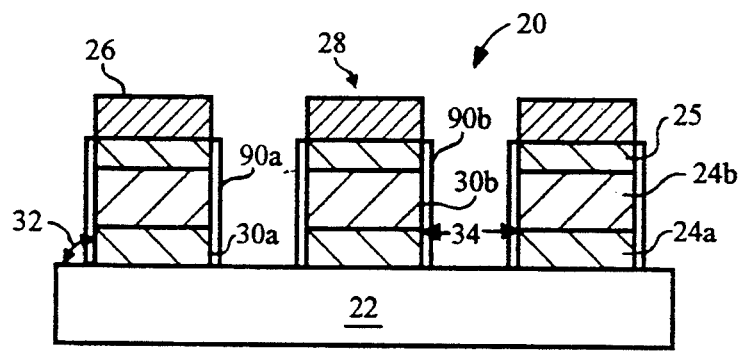
FIG. 1b is a schematic view in vertical cross-section of the substrate of FIG. 1a after etching of the substrate.

With reference to FIGS. 1a and 1b, the substrate 20 can be a metal, glass, or ceramic wafer 22 such as a semiconductor wafer. Typically, the substrate 20 is a silicon or gallium arsenide wafer 22 having a plurality of layers 24 thereon. The layers 24 can include metal, oxide, nitride, and silicide layers, the upper layer 25 being a molybdenum silicide layer. Typically, the molybdenum silicide layer has a composition of $MoSi_x$, with x being about 2. However, the $MoSi_x$ layer can also be nonstoichiometric and can contain other metals or alloys.

A resist material 26, such as photoresist or oxide hardmask, which is substantially resistant to etching is applied on top of the substrate layers 24. The resist 26 can be applied in a patterned overlay as shown in FIG. 1a. The resist 26 overlay protects portions of the substrate 20, so that after the substrate 20 is etched, the protected portions of the substrate 20 form features 28 that are part of the semiconductor device being processed. The features 28 have widths or thicknesses from about 0.6 to about 1 micron. The features 28 also have sidewalls 30 that form angles 32 with the surface of the substrate 20. The features 28 can either be "dense" or closely packed on the substrate 20, with the spans 34 between the features 28 being about 0.8 microns in width, or the features 28 can be "open" or spaced apart with the spans 34 being about 20 microns wide.

Figure 2:
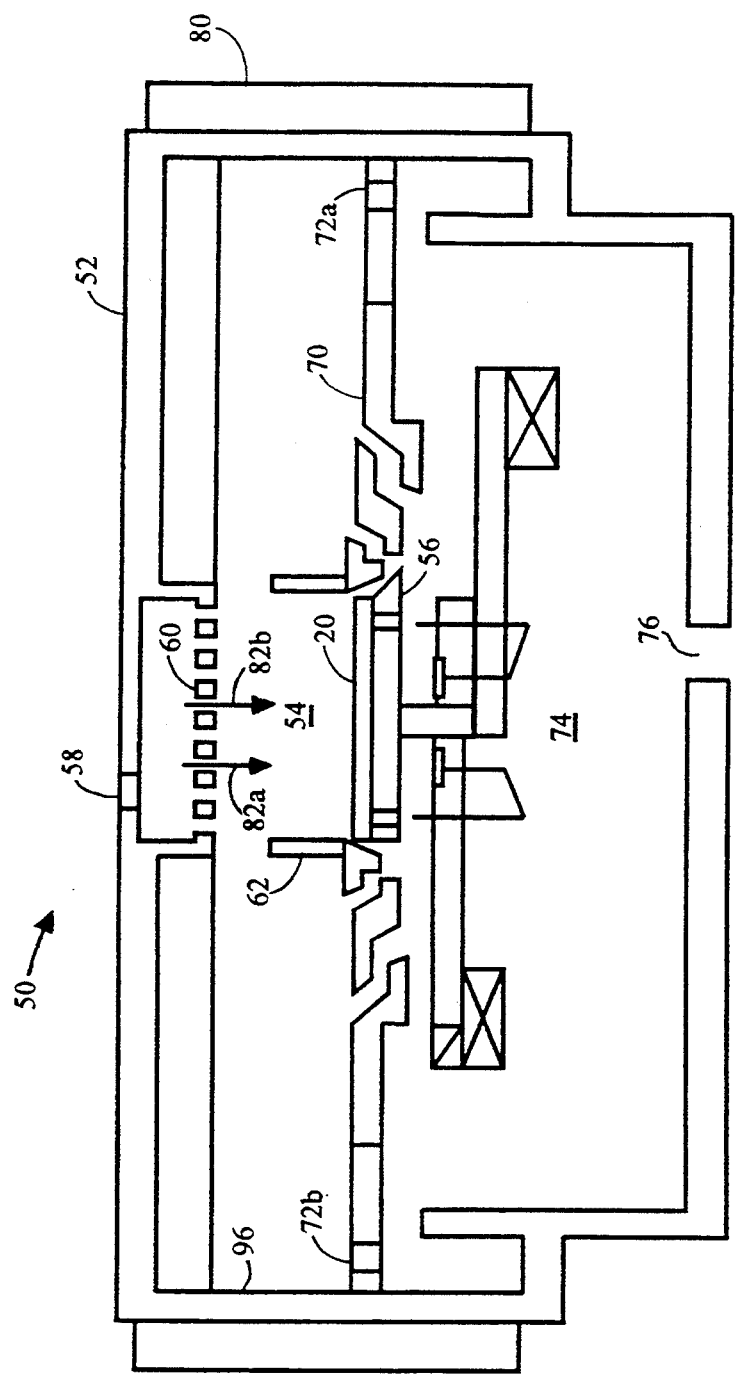
FIG. 2 is a schematic view in vertical cross-section of an apparatus suitable for practicing the process of the present invention.

With reference to FIG. 2, an apparatus 50 suitable for practicing the present invention comprises an etching chamber 52 having an etch zone 54. The substrate 20 is typically placed on a cathode or susceptor 56 in the etch chamber 52. Process gas is introduced into the etch chamber 52 through the gas inlet 58. Thereafter, the gas passes through a "showerhead" diffuser plate 60 which distributes the process gas in the etch zone 54. A focus ring 62 can be used to maintain the plasma substantially in the etch zone 54.

A barrier or pumping plate 70 with a plurality of exhaust holes 72 therethrough separates the etching chamber 52 into two zones, an etching zone 54 and a non-etching zone 74. The exhaust holes 72 are in fluid communication with a vacuum pump through the exhaust hole 76 for withdrawing spent process gas and volatile etch-byproduct compounds from the etching chamber 52. The apparatus 50 can be a magnetically enhanced reactor, having a magnetic coil 80 around the etching chamber 52 to magnetically enhance the plasma formed in the etching zone 54.

The process conditions can be varied during the etching process. For example, when etching multiple layers 24 and 25 of the substrate 20, typically the process has multiple stages. The process conditions for each stage depends upon the composition of the layer that is being etched. Furthermore, when the substrate 20 is etched in multiple stages, the progress of the etch is monitored by monitoring the composition of the gas withdrawn from the chamber using a optical emission technique. When the composition of the withdrawn gas changes, it signifies that one layer has been etched through and the second layer is being etched. At this time, the composition of the process gases and other process conditions can be changed to provide greater etching efficiency for the layer being etched. For example, when etching $MoSi_x$ deposited on a silicon layer, the "main" etch or the etching of the $MoSi_x$ layer 25 was typically carried out about zero to ten seconds after a rise in the SiF emission spectra was observed.

To use the apparatus 50, a substrate 20 is placed on the cathode 56, and a process gas comprising $SF_6$ and HBr is introduced through the gas inlet 58 into the etch zone 54. The process gas can further comprise an oxygen containing gas such as $O_2$, $O_3$, CO, $CO_2$, $H_2O$ and mixtures thereof. Preferably the oxygen containing gas is $O_2$. $SF_6$ is the primary etchant, and the HBr and the oxygen containing gas are included to provide better control of feature profile, etch selectivity ratio, and etch rates. A plasma is generated in the etch zone 54 to form an etch gas from the process gas, which selectively etches the substrate 20. The flow of the etch gas is shown by the arrows 82.

The composition of the process gas is controlled by adjusting the volumetric flow ratio of $SF_6$ to HBr to oxygen containing gas. By "volumetric flow ratio" it is meant the ratio of the volume per unit time of one gas to the volume per unit time of a second gas.

Preferably, the volumetric flow ratio of $SF_6$:HBr:oxygen containing gas is selected so that the sidewalls 30 of the features 28 have smooth surfaces without jagged or rough edges and so that the sidewalls 30 form angles 32 of at least about 85° with the wafer 22. Preferably, the ratio is selected so that the sidewalls 30 form angles 32 of about 85° to 90° with the wafer 22. Features 28 having perpendicular sidewalls 30 are desired for optimum integrated circuit design and performance. More preferably, the volumetric flow ratio of $SF_6$ to HBr to oxygen containing gas is selected so that the molybdenum silicide etch rate is greater than about 500 Å/minute. Most preferably the flow ratio is selected so that the molybdenum silicide to resist etching selectivity ratio is greater than about 0.6.

As explained in the examples provided below, it has been found that a volumetric flow ratio of $SF_6$:HBr from about 1:10 to about 1:1 provides suitable etch rates, good feature profiles, and good etch selectivity ratio. Within this range, $SF_6$ and HBr flow ratios from about 3:17 to about 7:13 are more preferable, and a flow ratio of about 1:3 is most preferable, providing features having profile angles 32 from about 85° to 9020 and an etch selectivity greater than 0.6. It is believed that the addition of oxygen provides higher etch rates and reduces the amount of residue deposit formed on the chamber walls and on the sidewalls 30 of the features 28. Preferably, the volumetric flow ratio of $SF_6$ to oxygen containing gas is from about 0.1:1 to about 100:1, more preferably, the flow ratio is from about 1:1 to about 10:1, and most preferably, the flow ratio is from about 1:1 to about 3:1.

The process gas should be introduced at a sufficient rate so that the rate of etching the substrate 20 is greater than about 500 Å per minute. For the apparatus 50, tile total flow rate of $SF_6$ and HBr is preferably from about 50 to about 100 sccm and more preferably about 80 sccm. However, the optimum flow rate can vary depending on the reactor size and flow characteristics.

After the process gas is introduced into the etch zone 54, a plasma is generated in the etch zone 54 to form an etch gas from the process gas for etching the substrate 20. The power flux of the plasma should be from about 0.21 w/cm$^2$ to about 0.57 w/cm$^2$. Thus, the power used to generate the plasma is typically from about 150 to about 400 watts, and more preferably about 250 to about 300 watts for a 6 inch (15.25 cm) diameter wafer.

The plasma may be enhanced by a method such as electron cyclotron resonance, magnetically enhanced reactors and inductively coupled plasma. Preferably, a magnetically enhanced ion reactor is used. The magnetic field in the reactor induced by the magnetic coil 80 must be sufficiently strong to increase the density of the ions formed in the plasma, but not so strong as to induce charge-up damage, which would damage features such as CMOS gates. Typically, the magnetic field on the surface of the substrate 20 is from about 10 to about 100 Gauss, more preferably from about 20 Gauss to about 80 Gauss, and most preferably about 75 Gauss.

Typically, the chamber is maintained at a pressure of from about 1 mTorr to about 300 mTorr, preferably from about 50 mTorr to 250 mTorr, and more preferably from 100 to 160 mTorr. Lower pressures provide more uniform etching, at the expense of lower etch rates.

The cathode 56 can also be heated using a heating source, such as a lamp, underneath the cathode 56. The cathode 56 is preferably heated to temperatures sufficiently high to volatilize etching by-products, and sufficiently low so that the thin layer of passivating deposit 90 that forms on the sidewalls 30 of freshly etched features 28 is not volatilized. Typically, the cathode 56 is heated to a temperature of about 20° to about 100° C., and more preferably at a temperature of about 65° C. A flow of helium on the back of the substrate 20 at a pressure of about 4 Torr, can be used to control the temperature of the substrate 20.

The chamber wall 96 should be also heated so that less deposit forms on the walls 96. The chamber wall 96 typically is heated to a temperature from about 45° C. to about 100° C., and more typically to a temperature of about 65° C.

EXAMPLES

The following examples demonstrate the efficacy of the present invention. These examples are undertaken using a magnetically enhanced reactive ion reactor, and in particular, a "PRECISION 5000" system with a "PHASE II POLYETCH" chamber kit, fabricated by Applied Materials, Santa Clara, Calif.

Silicon wafers having a diameter of about 150 mm (6 inches) and a thickness of 0.73 mm were used for these experiments. The wafers 22 had a layer 25 of $MoSi_x$ of thickness 3400 Å. Underneath the molybdenum disilicide layer was a 1000 Å layer of polysilicon, and below the polysilicon layer was a 2000 Å of silicon oxide. The molybdenum silicide layer was coated with a patterned overlay of "G-line KALLE PR" photoresist, fabricated by Hoechst, Germany. The photoresist lines had widths of about 0.8 μm and occupied about 50% of the total area of the wafer.

After etching, the thickness of the photoresist layer 26 remaining on the substrate 22, the smoothness of the sidewalls 30, the angles 32 between the sidewalls 30 and the substrate 22 and the amount of residue 90 remaining were evaluated from scanning electron microscope photos of the etched wafers. Etch rates were calculated by measuring the depth of the features 28 in etched substrates 20.

Residual resist 26 and sidewall deposition 90 were removed by dry stripping in combination with a wet process. The dry stripping was carried out in a "GASONICS" resist stripper for two minutes using an oxygen and $CF_4$ plasma. In the wet stripping process, the substrate was dipped for about five minutes in a solution comprising one part 30% conc. $NH_4OH$, two parts 30% conc. $H_2O_2$, and seven parts water, heated to about 50° C. to 70° C.

The following examples demonstrate that a process according to the present invention has a high etch rate (greater than 500 Å per minute), good substrate to resist selectivity, and satisfactory sidewall profile of the features formed below the resist. Also, the process provides greatly reduced amounts of deposit on the chamber walls and on the sidewalls of the freshly etched channels. Furthermore, existing reactive-ion etching equipment can be used.

EXAMPLES 1 AND 2

Examples 1 and 2 were run to determine the feasibility of using $SF_6$ and HBr for etching $MoSi_x$ layers. In Example 1, a wafer (as described above) was etched in a single stage process using 25% $SF_6$ (20 sccm) and 75% HBr (60 sccm). A chamber pressure of 100 mTorr, a power level of 200 Watts, and a magnetic field of 75 Gauss was used. The cathode and wall temperature were both maintained at 65° C. The wafer was etched for about 652 seconds to remove the $MoSi_x$ layer. This experiment demonstrated the feasibility of using $SF_6$ and HBr to etch the $MoSi_x$ layer.

In Example 2, a wafer was etched using the same ratio of $SF_6$ (20 sccm) and HBr (60 sccm), and in addition, 8 sccm of oxygen was added to the process gas in order to improve etching rates. The chamber pressure, power level, magnetic field, cathode temperature, and wall temperature were the same as in Example 1. In this example, the $MoSi_x$ layer etched through in about 239 seconds. Thus, the addition of oxygen to the process gas improved the etching rate.

EXAMPLES 3-12

Examples 3-12 were run in order to optimize the etching process conditions by using a factorial design study involving a $L_9(3^4)$ orthogonal matrix. Four process variables, namely (i) power, (ii) $SF_6$:HBr ratio, (iii) $O_2$ flow rate, and (iv) chamber pressure were each varied at three levels as shown in Table I. The total volumetric flow rate of $SF_6$:HBr was maintained at about 80 sccm. The magnetic field was maintained at 75 Gauss. The cathode temperature and chamber wall temperature were both maintained constant at 65° C., and helium was flowed at a pressure of 4 Torr on the backside of the wafer to cool the wafer.

TABLE I

| $L_9 (3^4)$ ORTHOGONAL MATRIX CONDITIONS | | | |
|---|---|---|---|
| | Level | | |
| Variables | I | II | III |
| $SF_6$ %[1] | 15 | 25 | 35 |
| ($SF_6$:HBr ratio) | (3:17) | (1:3) | (7:13) |
| Pressure (mTorr) | 100 | 130 | 160 |
| $O_2$ (sccm) | 2 | 6 | 10 |
| Power (watts) | 200 | 250 | 300 |

Notes:
[1]The percent of $SF_6$ was the percent with respect to the HBr content, so 25% $SF_6$ level means the process gas includes 25% $SF_6$ and 75% HBr, or that the $SF_6$:HBr ratio was 1:3.

Table II shows the process conditions and experimental results for Examples 3 through 12. Examples 3 through 11 were based on the $L_9$ orthogonal matrix process conditions. Example 12 had the same process conditions as Example 3 and was run to determine the accuracy of the experimental results obtained for Example 3.

Figure 3A:
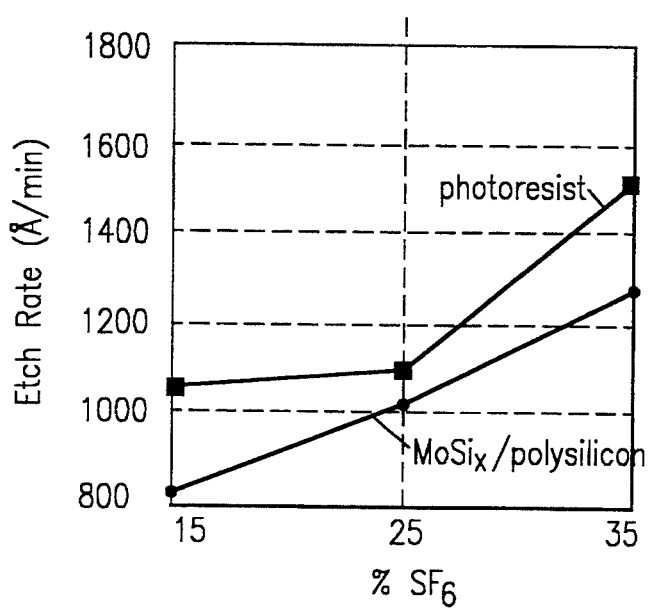
FIG. 3a is a graph showing the change in rate of etching of (i) $MoSi_x$ and polysilicon, and (ii) photoresist, with change in $SF_6$ to HBr volumetric flow ratio.

FIG. 3a shows the change in etch rate of (i) $MoSi_x$ and polysilicon, and (ii) photoresist with change in $SF_6$ to HBr volumetric flow rate. The MoSi$_x$/polysilicon and photoresist etch rates for Examples 6, 7, and 8 which used 25% SF$_6$ were averaged and plotted against the SF$_6$ percentage in question. Although the etching rates increased with increase in SF$_6$, the MoSi$_x$ etch rate did not change at the same rate as the photoresist etch rate.

Figure 3B:
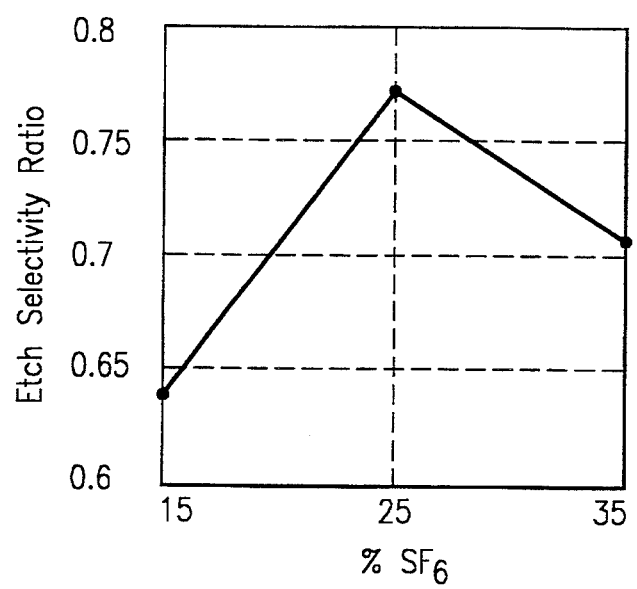
FIG. 3b is graph showing the change in etch selectivity ratio with change in $SF_6$ to HBr volumetric flow ratio.

FIG. 3b shows the etch selectivity ratio as a function of SF$_6$ content. The etch selectivity ratio was calculated by dividing the average MoSi$_x$/polysilicon etch rate by the average resist etch rate. The graph was U-shaped with a maximum etch selectivity ratio greater than 0.75 at 25% SF$_6$ content.

From the results of Table II, an optimum ratio of SF$_6$:HBr was determined to be about 1:3. It was also determined that as the oxygen flow rate increases, the profile angle 32, etch rates, and selectivity ratio all increased. With increase in power, the profile angle and etch rates increase and the selectivity ratio decreased, and with increase in pressure, the profile angle and the selectivity ratio both increased. These results were used to determine optimum process conditions which were used for the Examples below.

EXAMPLES 13 AND 14

In these examples, two step etching processes were

TABLE II

| Examples | PROCESS CONDITIONS AND RESULTS OF EXAMPLES 3–12 | | | | | | | | | |
|---|---|---|---|---|---|---|---|---|---|---|
| | 3 | 4 | 5 | 6 | 7 | 8 | 9 | 10 | 11 | 12 |
| SF$_6$ (%) | 15.00 | 15.00 | 15.00 | 25.00 | 25.00 | 25.00 | 35.00 | 35.00 | 35.00 | 15.00 |
| O$_2$ (sccm) | 2.00 | 6.00 | 10.00 | 6.00 | 10.00 | 2.00 | 10.00 | 2.00 | 6.00 | 2.00 |
| Pressure (mTorr) | 100.00 | 130.00 | 160.00 | 100.00 | 130.00 | 160.00 | 100.00 | 130.00 | 160.00 | 100.00 |
| Power (Watts) | 200.00 | 250.00 | 300.00 | 300.00 | 200.00 | 250.00 | 250.00 | 300.00 | 200.00 | 200.00 |
| MoSi$_x$ and Polysilicon Etch Rate (Å/min)[1] | 435.64 | 835.44 | 1205.48 | 1147.83 | 992.48 | 923.08 | 1419.35 | 1227.91 | 1152.84 | 445.95 |
| Photoresist Etch Rate (Å/min)[2] | 564.00 | 1088.00 | 1518.00 | 1547.00 | 850.00 | 873.00 | 1723.00 | 1820.00 | 988.00 | 630.00 |
| Selectivity Ratio[3] | 0.77 | 0.77 | 0.79 | 0.74 | 1.17 | 1.06 | 0.82 | 0.67 | 1.17 | 0.71 |
| Profile Angle Center Dense[4] (°) | 84.00 | 87.50 | 90.50 | 87.00 | 90.50 | 86.00 | 91.50 | 92.00 | 93.00 | 82.00 |
| Profile Angle Center Open[4] (°) | 78.00 | 87.00 | 91.00 | 82.00 | 87.00 | 84.00 | 91.00 | 92.50 | 92.00 | 77.50 |
| Profile Angle Edge Dense[4] (°) | 83.00 | 88.00 | 91.50 | 89.00 | 92.00 | 88.00 | 92.00 | 93.50 | 91.50 | 82.00 |
| Profile Angle Edge Open[4] (°) | 78.00 | 84.50 | 91.50 | 83.00 | 88.00 | 84.00 | 90.50 | 90.50 | 93.00 | 78.50 |

[1] Combined etch rate for MoSi$_x$ and polysilicon layers.
[2] Calculated assuming the initial thickness of photoresist was 1.38 microns.
[3] Selectivity ratio = (MoSi$_x$ and polysilicon etch rate)/(photoresist etch rate).
[4] Profile angle for the central and edge areas of the wafer and for "dense" and "open" feature densities. The dense regions of the wafer had closely spaced features, the average span or distance between the features being about 0.8 microns, while the open areas had features spanned by distances of about 20 microns.

Figure 4:
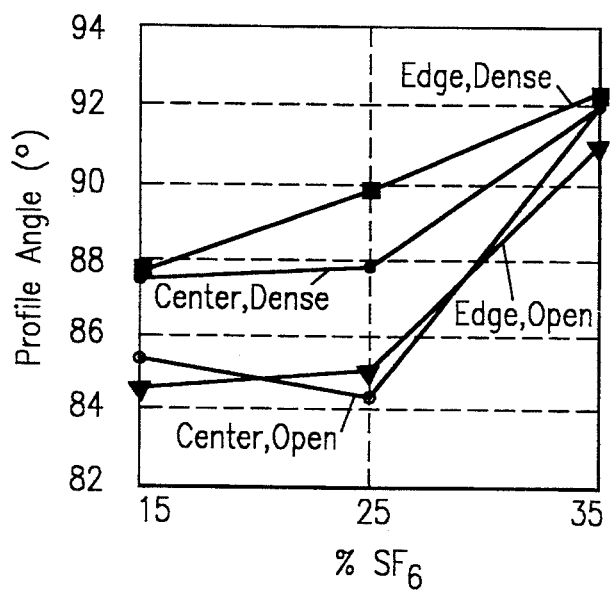
FIG. 4 is a graph showing the change in feature profile angle with change in $SF_6$ to HBr volumetric flow ratio.

FIG. 4 shows the change in feature profile angle 32 with change in percentage of SF$_6$ for dense (closely packed features) and open areas, and for the center and edge areas of the wafer 22. The profile angles are averages of the experimental results listed in Table II. In general, angles 32 from about 85° to about 92° were obtained. From 15% to 25% SF$_6$ content, the profile angle 32 was between 84° to 86° in the open areas of the wafer 22 and between 87 to 90° in the dense wafer regions. At 35% SF$_6$ the features 28 had profile angles of about 90°. The graph also shows profile microloading, namely, the variation in profile angle 32 for dense and open areas of the wafer 22. As seen form the graph, a maximum variation was observed between the open and dense features on the wafer 22.

run with a main etch step and an overetch step as identified in Table Ill. The main etch process parameters were determined from the design matrix study. In the main etch step, the SF$_6$:HBr volumetric flow ratio was maintained at 1:3, and flow ratio of SF$_6$:O$_2$ was maintained at about 10:3. These process conditions provided he best results.

In both Examples 13 and 14, the overetch step was carried out to etch the underlying polysilicon layer below the MoSi$_x$ layer, and was started about 10 seconds after peaking of the silicon spectra. In Example 13, overetching was carried out using pure HBr, and in Example 14 a mixture of gasases comprising HBr, Cl$_2$, He, and O$_2$ was used.

TABLE III

| DESCRIPTION | MAIN ETCH CONDITIONS FOR EXAMPLES 13 AND 14 | OVERETCH CONDITIONS FOR EXAMPLE 13 | OVERETCH CONDITIONS FOR EXAMPLE 14 |
|---|---|---|---|
| SF$_6$ (sccm) | 20 | — | — |
| HBr (sccm) | 60 | 80 | 30 |
| O$_2$ (sccm) | 6 | — | — |
| Cl$_2$ (sccm) | — | — | 10 |
| 70% He/30% O$_2$ (sccm) | — | — | 6 |
| Pressure (mTorr) | 150 | 50 | 100 |
| B-Field (gauss) | 75 | 75 | 75–100 |
| Power (watts) | 300 | 250 | 150 |
| Time (sec) | 216 (EP) | 90 | 360 |
| MoSi$_x$ Etch Rate (Å/min) | 1000 | — | — |
| MoSi$_x$ Uniformity[1] | ±12.5% | — | — |
| Photoresist Etch Rate (Å/min) | 1390 | — | — |
| Photoresist Uniformity | ±6.3% | — | — |
| Helium Cooling Pressure: | 4 Torr | | |
| Wall Temperature: | 65° C. | | |
| Cathode Temperature: | 65° C. | | |
| Endpoint Wavelength: | 4415Å (SiF line) | | |

TABLE III-continued

| DESCRIPTION | MAIN ETCH CONDITIONS FOR EXAMPLES 13 AND 14 | OVERETCH CONDITIONS FOR EXAMPLE 13 | OVERETCH CONDITIONS FOR EXAMPLE 14 |
|---|---|---|---|
| Focus Ring Diameter: | 155 mm | | |
| Number of Gas Plate Holes: | 13 | | | gases comprising HBr, $Cl_2$, He, and $O_2$ was used. The gases in Example 14 resulted in pullback of the resist 26 and gave jagged $MoSi_x$ feature profiles in the open areas of the wafer. Only the pure HBr overetch was able to give smooth feature profiles. Thus, a pure HBr overetch provided the best results.

After etching, the typical profile angle 32 of the etched features 28 were measured by SEM to be about 87°. The polysilicon layer was slightly undercut, the maximum oxide underlayer loss was about 1330Å, and the maximum resist loss was measured at about 6000Å.

After etching, oxygen was introduced into the etching zone, and reacted with the residual photoresist layer for about two minutes. Then a five-minute wet stripping process using one part 30% $NH_4OH$, two parts 30% $H_2O_2$, and seven parts water heated 50° C. was used to remove residual photoresist.

The present invention has been described in considerable detail with reference to certain preferred versions thereof, however, other versions are possible. Therefore, the spirit and scope of the appended claims should not be limited to the description of the preferred versions contained herein.

What is claimed is:

1. A method for selectively etching a substrate having a molybdenum silicide layer with a resist material on the portions of the molybdenum silicide layer, the method comprising the steps of:
   (a) placing a substrate into an etch zone;
   (b) introducing a process gas comprising $SF_6$ and HBr into the etch zone, the volumetric flow ratio of $SF_6$:HBr being from about 1:10 to about 1:1; and
   (c) generating a plasma in the etch zone to form an etch gas from the process gas, wherein the etch gas selectively etches the molybdenum silicide layer on the substrate.

2. The method of claim 1, wherein the process gas further comprises an oxygen containing gas.

3. The method of claim 2, wherein the molybdenum silicide layer is etched to form features that have sidewalls, and wherein the volumetric flow ratio of $SF_6$:HBr:oxygen containing gas is selected so that the sidewalls are smooth and form angles of at least about 85° with the substrate.

4. The method of claim 3, wherein the volumetric flow ratio of $SF_6$:HBr:oxygen containing gas is selected so that the sidewalls form angles from about 85° to about 90° with the substrate.

5. The method of claim 2, wherein the volumetric flow ratio of $SF_6$:HBr:oxygen containing gas is selected so that the molybdenum silicide to resist etching selectivity ratio is greater than about 0.6.

6. The method of claim 2, wherein the volumetric flow ratio of $SF_6$:HBr:oxygen containing gas is selected so that molybdenum silicide etch rate is greater than about 500 Å/minute.

7. The method of claim 1, wherein the volumetric flow ratio of $SF_6$:HBr is from about 3:17 to about 7:13.

8. The method of claim 7, wherein the volumetric flow ratio of $SF_6$:HBr is about 1:3.

9. The method of claim 2, wherein the oxygen containing gas is selected from the group consisting of $O_2$, $O_3$, CO, $CO_2$, $H_2O$ and mixtures thereof.

10. The method of claim 2, wherein the volumetric flow ratio of $SF_6$ t oxygen containing gas is from about 0.1:1 to about 100:1.

11. The method of claim 10, wherein the volumetric flow ratio of $SF_6$ to oxygen containing gas is from about 1:1 to about 10:1.

12. The method of claim 11, wherein the volumetric flow ratio of $SF_6$ to oxygen containing gas is from about 1:1 to about 3: 1.

13. The method of claim 1, wherein the pressure in the etch zone is from about 50 to about 250 mTorr.

14. The method of claim 13, wherein the pressure in the etch zone is from about 100 to about 160 mTorr.

15. The method of claim 1, wherein the step of introducing a process gas comprises introducing sufficient process gas so that the rate of etching the substrate is greater than about 500 Å per minute.

16. The method of claim 1, wherein the substrate comprises a semiconductor wafer selected from the group consisting of silicon and gallium arsenide wafers, the wafer having a plurality of layers thereon, the layers being selected from the group consisting of metal, oxide, nitride, silicide, and the mixtures thereof.

17. A method for selectively etching a substrate, comprising the steps of:
   (a) placing a substrate selected from the group consisting of silicon and gallium arsenide wafers into an etch zone, the substrate having thereon (i) a plurality of layers selected from the group consisting of metal, oxide, nitride, silicide, and mixtures thereof, (ii) a molybdenum silicide layer, and (iii) a resist material on portions of the molybdenum silicide layer;
   (b) introducing a process gas into the etch zone, the process gas comprising $SF_6$, HBr, and $O_2$, wherein the volumetric flow ratio of $SF_6$:HBr is from about 1:10 to about 1:1, and the volumetric flow ratio of $SF_6$:$O_2$ is from about 0.1:1 to 100:1;
   (c) generating a plasma in the etch zone to generate from the process gas an etch gas that etches the substrate layers to create volatile etch byproduct compounds; and
   (d) removing the volatile etch byproduct compounds from the etch zone.

* * * * *